(12) United States Patent
Bruce et al.

(10) Patent No.: US 7,562,337 B2
(45) Date of Patent: Jul. 14, 2009

(54) OPC VERIFICATION USING AUTO-WINDOWED REGIONS

(75) Inventors: James A. Bruce, Williston, VT (US); Gregory J. Dick, Beacon, NY (US); Donald P. Perley, South Burlington, VT (US); Jacek G. Smolinski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 11/609,033

(22) Filed: Dec. 11, 2006

(65) Prior Publication Data

US 2008/0141211 A1   Jun. 12, 2008

(51) Int. Cl.
G06F 17/50 (2006.01)
G06F 19/00 (2006.01)
G03F 1/00 (2006.01)
G21K 5/00 (2006.01)
G06K 9/00 (2006.01)

(52) U.S. Cl. .................. 716/21; 700/120; 700/121; 430/5; 378/35; 382/144

(58) Field of Classification Search ............. 716/21; 700/120, 121; 430/5; 378/35; 382/144
See application file for complete search history.

(56) References Cited

U.S. PATENT DOCUMENTS

| | | | |
|---|---|---|---|
| 6,282,696 B1 * | 8/2001 | Garza et al. ............... 716/19 |
| 6,576,147 B2 | 6/2003 | Mukai | |
| 6,578,190 B2 * | 6/2003 | Ferguson et al. ........... 716/21 |
| 6,824,931 B2 | 11/2004 | Liu et al. | |
| 6,899,981 B1 * | 5/2005 | Galan et al. ............... 430/5 |
| 6,952,818 B2 | 10/2005 | Ikeuchi | |
| 7,123,356 B1 * | 10/2006 | Stokowski et al. ........ 356/237.2 |
| 7,281,222 B1 * | 10/2007 | Babcock ................... 716/4 |
| 7,293,249 B2 * | 11/2007 | Torres Robles et al. ...... 716/8 |
| 7,340,706 B2 * | 3/2008 | Golubtsov et al. ........... 716/5 |
| 7,493,577 B2 * | 2/2009 | Rodin et al. ............... 716/5 |
| 2002/0091986 A1 * | 7/2002 | Ferguson et al. ........... 716/19 |
| 2003/0044692 A1 | 3/2003 | Liu et al. | |
| 2003/0061592 A1 * | 3/2003 | Agrawal et al. ............ 716/19 |
| 2004/0005089 A1 * | 1/2004 | Robles et al. .............. 382/141 |
| 2004/0019870 A1 | 1/2004 | Ohmori | |
| 2004/0063000 A1 * | 4/2004 | Maurer et al. ............... 430/5 |
| 2004/0139418 A1 | 7/2004 | Shi et al. | |
| 2005/0008953 A1 | 1/2005 | Dulman et al. | |
| 2005/0055658 A1 * | 3/2005 | Mukherjee et al. .......... 716/19 |
| 2005/0149902 A1 | 7/2005 | Shi et al. | |
| 2005/0229130 A1 | 10/2005 | Wu et al. | |
| 2005/0257181 A1 | 11/2005 | Wu | |

(Continued)

*Primary Examiner*—Phallaka Kik
(74) *Attorney, Agent, or Firm*—Todd M. C. Li; Daryl Neff

(57) ABSTRACT

A method is provided for performing optical proximity correction ("OPC") verification in which features of concern of a photomask are identified using data relating to shapes of the photomask, an aerial image to be obtained using the photomask, or a photoresist image to be obtained in a photoimageable layer using the photomask. A plurality of areas of the photomask, aerial image or photoresist image are identified which incorporate the identified features of concern, where the plurality of identified areas occupy substantially less area than the total area of the photomask that is occupied by features. Enhanced OPC verification limited to the plurality of identified areas is then performed to identify problems of at least one of the photomask, aerial image or photoresist image.

19 Claims, 6 Drawing Sheets

U.S. PATENT DOCUMENTS

| | | |
|---|---|---|
| 2005/0278686 A1* | 12/2005 | Word et al. .................... 716/21 |
| 2006/0117292 A1* | 6/2006 | Rodin et al. ................... 716/19 |
| 2007/0079277 A1* | 4/2007 | Golubtsov et al. ............ 716/19 |
| 2008/0077907 A1* | 3/2008 | Kulkarni ....................... 716/20 |
| 2008/0174756 A1* | 7/2008 | Granik ......................... 355/67 |

* cited by examiner

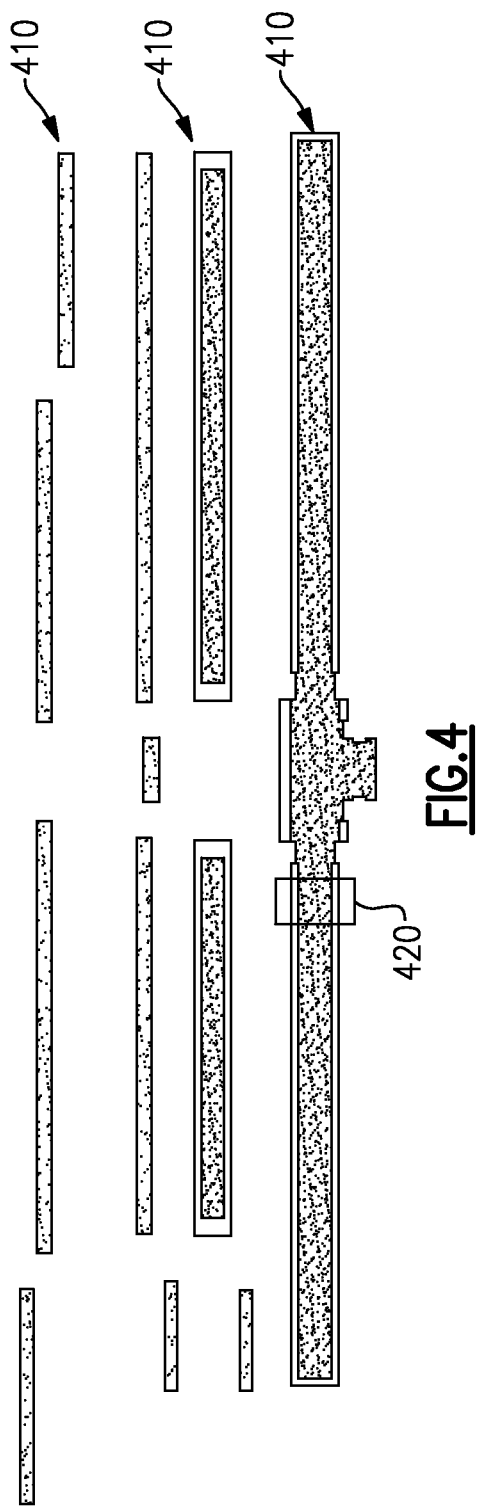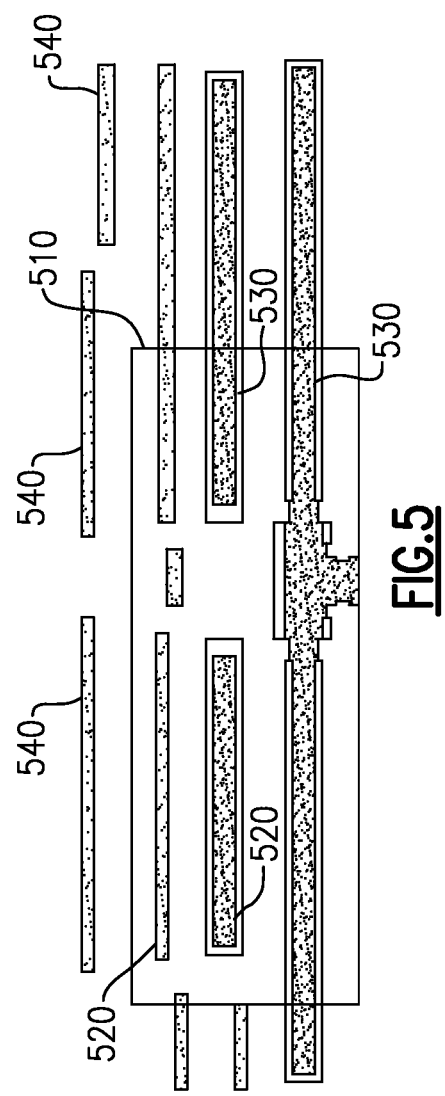

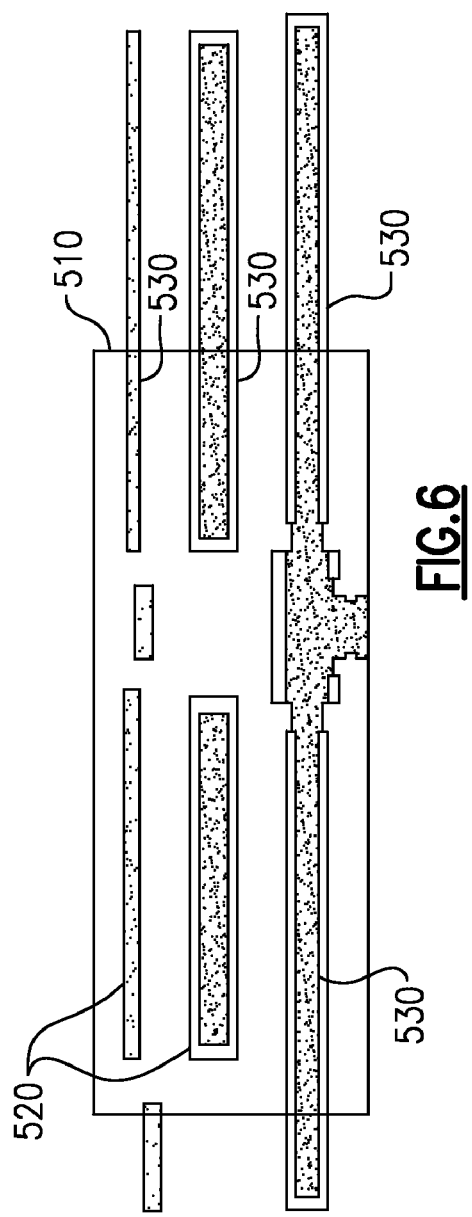
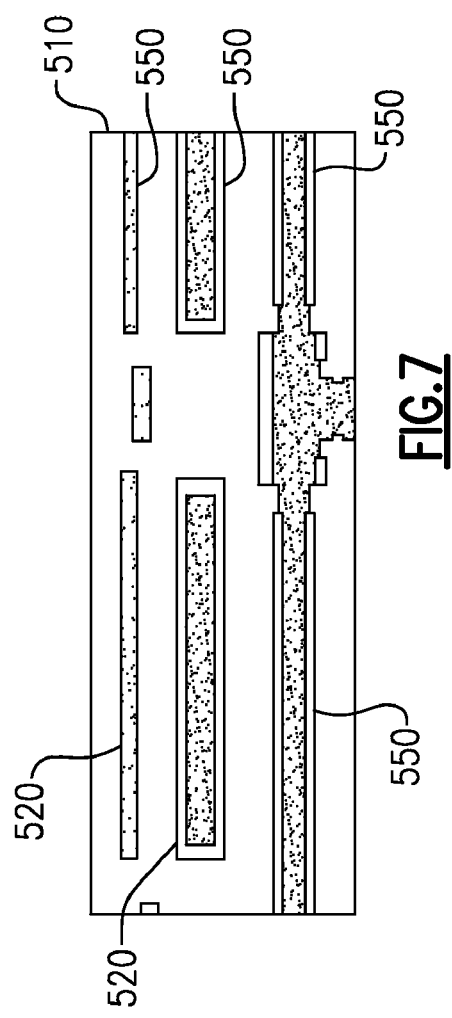

OPC VERIFICATION USING AUTO-WINDOWED REGIONS

BACKGROUND OF THE INVENTION

The present invention relates to photolithography and more specifically to the verification of a photomask for use in photolithography.

Photomasks and reticles (hereinafter, "photomasks" or "masks") are used in photolithography with an exposure source to cast images in photoimageable films such as photoresists. Masks typically are partially transparent and partially opaque, often having a transparent quartz substrate with chrome metal patterns defining the opaque patterns thereon. The design of a mask is a complicated process. In order to correctly pattern the photoimageable film, the opaque features of the mask need to appear different from the patterns intended to be achieved in the photoimageable film. This arises because optical proximity effects upon the photolithographic exposure of nearby features must be compensated. As examples of optical proximity effects, lines on the mask can appear shorter when printed on the photoimageable film, and lines which are isolated (features which are not near other neighboring features) tend to shrink in width as they appear in the exposed photoimageable film. On the other hand, lines which are "nested", that is, lines which lie between other neighboring lines, tend not to shrink as much as isolated lines.

Existing techniques for verifying the suitability of a mask or reticle for the photolithographic process can become computationally intensive, particularly when masks need to be verified for marginal exposure conditions, i.e., non-optimum focus and dose conditions. The process of verifying a mask involves determining whether the shapes on the mask will produce the desired exposure pattern in the photoimageable layer. As semiconductor chips can now contain several billion transistors per chip, the processing required to completely verify a photomask can take several days or even weeks to perform, even when significant computing resources are devoted to the task.

SUMMARY OF THE INVENTION

According to an aspect of the invention, a method is provided for performing optical proximity correction ("OPC") verification in which features of concern of a photomask are identified using data relating to shapes of the photomask, an aerial image to be obtained using the photomask, or a photoresist image to be obtained in a photoimageable layer using the photomask. A plurality of areas of the photomask, aerial image or photoresist image are identified which incorporate the identified features of concern, where the plurality of identified areas occupy substantially less area than the total area of the photomask that is occupied by features. Enhanced OPC verification limited to the plurality of identified areas is then performed to identify problems of at least one of the photomask, aerial image or photoresist image.

An information processing system operable to perform such method and a computer-readable recording medium having instructions recorded thereon which are executable to perform such method are provided in accordance with other aspects of the invention.

BRIEF DESCRIPTION OF THE DRAWINGS

FIG. 4 is a diagram illustrating an identified feature of concern in relation to shapes of an image.

FIG. 5 is a diagram illustrating the drawing of a bounding box for defining an area in which an enhanced OPC verification process is to be performed in accordance with an embodiment of the invention.

FIG. 6 is a diagram illustrating the discarding of features outside the bounding box which defines an area in which an enhanced OPC verification process is to be performed.

FIG. 7 is a diagram illustrating a step for limiting an enhanced OPC verification process to portions of features which lie within the bounding box.

DETAILED DESCRIPTION

The embodiments of the invention described herein provide improved ways of performing OPC verification. Desirably, the methods provided herein can be used to reduce the computational complexity needed to verify the design of a mask used to pattern a photoimageable layer. In accordance with embodiments of the invention, much of the area of the design of a mask is verified as being satisfactory, using a verification process that has less than the highest degree of computational intensity. A less computationally intensive verification process can be performed initially as to the whole mask to determine the existence of problems and which may also identify other concerns. Enhanced OPC verification is performed with respect to such areas of the mask design where concerns are identified. Alternatively, the less intensive process can be performed only in some areas of the mask or as to some features of the mask where such areas or features or both are considered to be relatively problem-free.

Figure 1A:
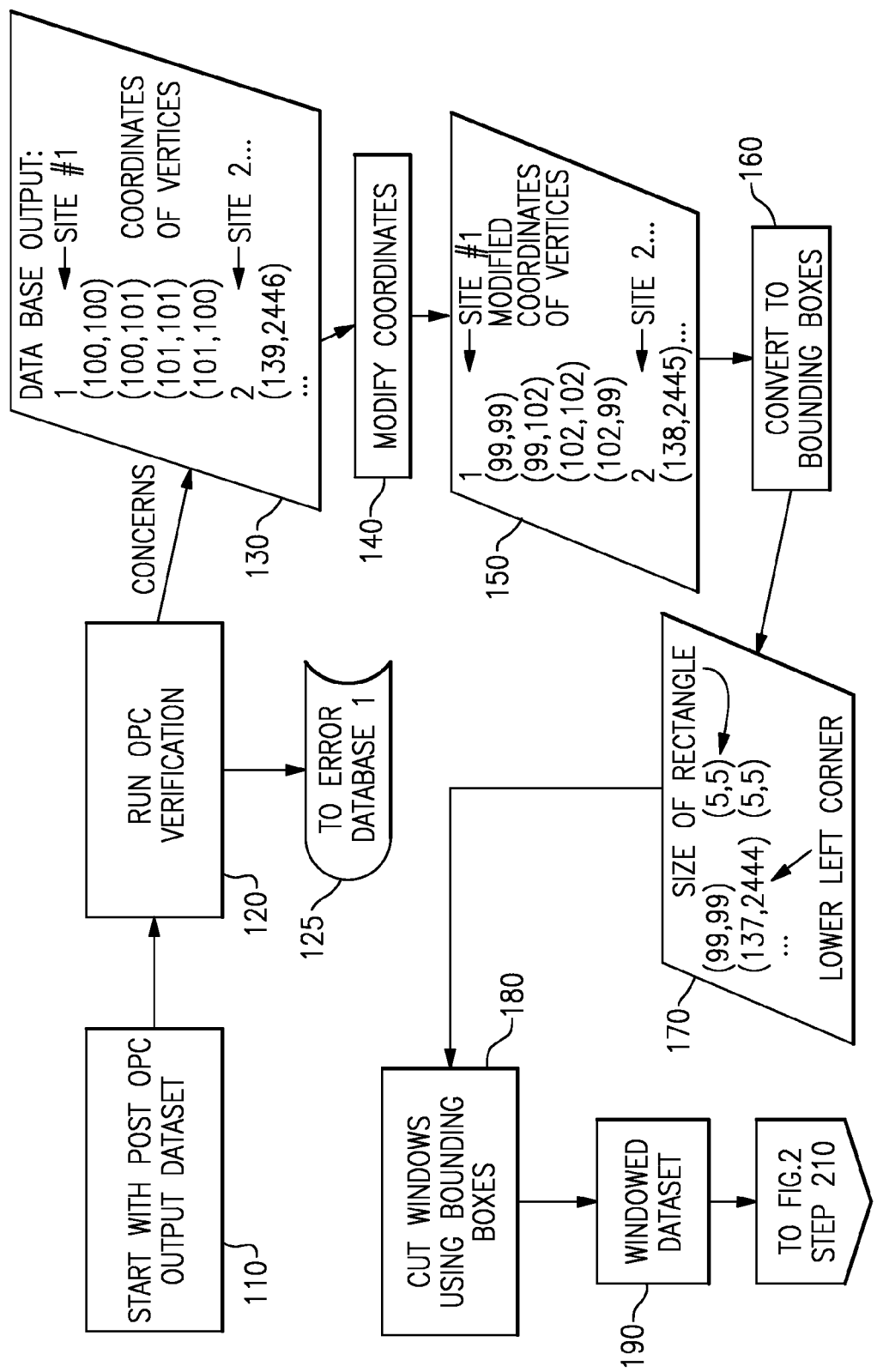
FIG. 1A is a flow chart illustrating a method of windowing regions for performing enhanced OPC verification in accordance with an embodiment of the invention.

FIG. 1A is a flow chart illustrating a method of performing OPC verification in accordance with one embodiment of the invention. As illustrated therein, a preliminary step 110 of the method begins after the design of a mask has already undergone a process for correcting for optical proximity effects of the shapes on the mask. Stated another way, the method begins with a data set describing a mask which has already been corrected by an optical proximity correction ("OPC") process. With the OPC corrected mask data, in step 120 a first verification process is performed. Desirably, the first verification process is performed in all areas of the mask and is performed at a computational intensity which is not the maximum used for the OPC verification system. A goal of this initial verification process is to identify features of concern of the mask to undergo an enhanced OPC verification process at a later stage of the method. The features of concern identified by this step are features which are deemed more difficult to print correctly in the photoimageable layer. Characteristics of the photolithographic printing process make the features of concern less likely to be printed correctly in relation to other features of the mask.

The verification process can be performed in several alternative ways. In one way, the verification process is performed by geometric analysis of the shapes of the mask. In geometric analysis, the areas, widths, lengths, etc. of the shapes of the mask and the spaces between them are compared to minimum and maximum values. Geometric analysis can be performed using data representing actual shapes of the mask, as obtained for example, from images of the prepared mask. Alternatively, geometric analysis can be performed from mask design data which precedes the fabrication of the mask. The verification process can be performed using mask design data which precedes OPC processing or can be performed using mask design data after having undergone OPC processing. The data obtained from images of the prepared mask are known as "actinic" mask inspection data and the data relating to the mask design data are known as "non-actinic" mask inspection data. As a result of performing the verification process, any errors identified in the mask shapes or other data are stored in an error database, as illustrated in block 125.

Examples of features of concern to be identified by geometric analysis of the mask data include features whose width is less than a specified action width "X", and any spaces whose width is less than a specified action width "Y". In another example, geometric analysis can be used to identify as a concern a feature which has width less than a specified action width "X1", where the feature is adjacent to a space having width greater than a specified action width "Y1". In another example, geometric analysis can be used to identify as a concern a feature which has width greater than a specified action width "X2", when the feature is adjacent to a space having width smaller than a specified action width "Y2". In another example, a missing assist feature can be identified as a feature of concern through geometric analysis when the mask has run length greater than a specified action length "C1". Other examples include contact features or via features of one level of a mask which are closer than a specified minimum distance "D1" to an edge of another feature, to an end of another feature, or to a corner of another feature in another level of the mask that the contact feature or via feature is intended to contact. In yet another example, features can be identified as presenting concerns where features of an alternating phase shift mask which have the same phase and are less than a distance "E1" apart from each other.

Figure 1B:
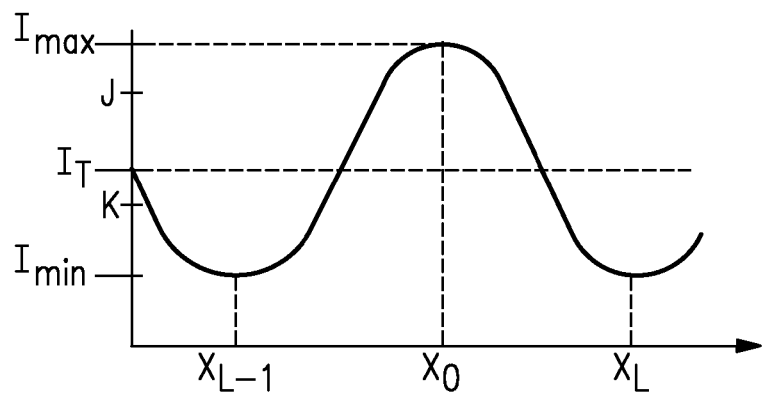
FIG. 1B is graph modeling an intensity of light versus distance for a simulated aerial image.

An alternative way that features of concern can be identified is by analyzing a simulated aerial image to be produced by the mask, given assumptions concerning the exposure to be made and the type of photoimageable material to be used. One type of aerial image simulation is called a "constant threshold" model, in that the width of each line and space are modeled by the intensity of the light which strikes each point of the surface of the photoimageable layer. Intensity rises and falls as a function of distance across each feature to be patterned in a photoimageable layer. Referring to FIG. 1B, intensity reaches a peak $I_{max}$ at the center $X_0$ of each feature and falls to minimum intensity $I_{min}$ at points $X_{L-1}$ and $X_L$ in spaces between features. Between the low at coordinate $X_{L-1}$ and the peak at $X_0$ the intensity rises with a finite slope. The intensity falls with a finite slope between the peak and the next low $X_L$. With the constant threshold model and assuming that a positive photoresist is used, rather than a negative photoresist, the exposed portion of the photoresist coincides with all the points of the intensity curve which lie above a constant threshold intensity level $I_T$.

Examples of features of concern to be identified through verification of the simulated aerial image include features which have maximum intensity less than "J" and features which have minimum intensity greater than "K" and features which have maximum intensity less than J and also have minimum intensity greater than K. Another case where a feature of concern can be identified is where the slope of the intensity curve of the aerial image is less than a value "L".

Alternatively, the OPC verification process can be performed in yet another way which also takes into account effects of processing using a photoresist. In this case, known as a "photoresist model", the effect of reaction, diffusion or both, and the effects of subsequent etch processing, chemical mechanical polishing ("CMP") or both may be considered. This approach models the aerial image to be produced by the mask in much the same way as with the above-described aerial image analysis. Other factors which affect the image produced in a photoresist layer or subsequent layer patterned by etching are modeled using empirical data from past experience. Stated another way, this photoresist model considers both the purely optical properties of the photolithography system including the mask and the effects of processing the photoresist layer, a layer subsequently patterned in accordance with the photoresist patterns, or both. Accordingly, the width of features that appear in the patterned photoresist layer or a layer that will be subsequently patterned using the photoresist layer is modeled by an intensity function that varies as a polynomial function of the properties of the aerial image, e.g., the maximum intensity, the minimum intensity, the slope of the intensity with distance, or a combination of these properties.

Other features of concern can be identified through OPC verification using a simulated photoresist model. With respect to the width of transistor gates, the gate width of a transistor of the simulated image can be identified as a feature of concern when the gate width is lower than a certain action width "g1". In another example, the gate width of a feature in the simulated image can be identified as a feature of concern when the difference between such gate width and a target gate width is greater than a specified action amount "g2". In yet another example, a feature of concern can be identified when the difference between the simulated gate width and the target gate width is less than a specified action amount "g3". In other examples, the gate length can be identified as a feature of concern when the length of a gate on the simulated image is lower than a certain action length "l1", or when the difference between the gate length of the simulated image is greater than a target gate length by more than a specified amount "l2", or, in another case, when the gate length of the simulated image is smaller than a target gate length by more than a specified amount "l3".

In another example of using a simulated photoresist model, spaces (areas between printed features) are identified as features of concern when they enclose area an area smaller than "Y" units. Another feature of concern relates to achieving intended degree of overlap between shapes of two different mask levels of the design. Thus, a feature of concern can be identified when a shape of the simulated image using one mask level of the design intersects with the shape of the simulated image using a different mask level of the design by less than a specified amount of overlap. The degree of overlap can be expressed either in linear terms as a number of microns or in terms of area (microns squared). Another feature of concern can be identified when shapes of different mask levels are too close together such that intended spacing between them in not sufficient.

Particular other features of concern include those in which a maximum dimension (length, width) of a simulated shape is less than a certain specified dimension "b", or when a minimum length or width of the simulated shape is greater than a specified minimum dimension "c" to be achieved. In another example, a shape of the simulated image is identified as a feature of concern when its slope is less than a specified value "d".

Another example of a feature of concern can be one in which the amount of pull-back of a line end observed in the simulated image (relative to the designed length of the line) is greater than a specified value "e". In another example, a feature of concern can be identified when the area of the simulated shape is less than an amount "f". In yet another example, a feature of concern can be identified when the area of a region enclosed by a simulated shape is less than a given value "h". The above examples are not intended to be exhaustive, as there may be other examples of features of concern which are identified through verification of the simulated image. In addition to or alternatively to the above cases, features of the simulated image which satisfy one or more combinations of the above exemplary cases can be identified as features of concerns.

Yet another way that features of concern can be identified is by analyzing an actual image produced in a photoresist layer using a completed prototype of the mask to determine whether the shapes therein meet required minimum sizes, maximum sizes or both, or the shapes meet any or all of the criteria used to evaluate a simulated image using the aforementioned constant threshold model or photoresist model.

Still another way that features of concern can be identified is through analysis of circuits and cells to be fabricated using the mask. Here, timing analysis or circuit simulation can be used to flag circuits and circuit elements which appear critical to performance. The names of a cell, net, or device or a combination of such names can be used to identify particular critical circuits or circuit elements, and locations of such elements in the mask can then be identified by referring to one or more relational databases which link the circuit design data to the mask shape data.

As further shown in step 130 of FIG. 1A, the features of concern are identified in a database in form of coordinates identifying their vertices in horizontal (x) and vertical (y) dimensions in the plane of the mask. Thus, for a particular feature of concern, the x-y coordinates of each of the vertices of a "site #1" are identified and stored in the database, the same is done for a "site #2" at the location of another feature of concern, and so on. As further illustrated in step 130, a set of x-y coordinate values (100, 100), (100, 101), (101, 101), (101, 100) identify the vertices of a first site (#1) where a first feature of concern has been identified, and other x-y coordinate values including the coordinates (139, 2446), etc., identify the vertices of a second site ("2").

Next, as illustrated in step 140 of FIG. 1A, a set of modified coordinates are generated from the coordinates stored in step 130, the modified coordinates defining expanded areas which encompass the features of concern. Typically, this step is performed by decreasing certain ones of the coordinate values and increasing others of the coordinate values so as to form a modified set of coordinate values which extend in left and right directions beyond the left and right edges of the original vertices, the modified coordinate values also extending in vertical directions beyond the top and bottom edges of each of the original vertices. Each coordinate value is increased or decreased in this step by an amount typically greater than the optical radius, i.e., beyond the distance from the feature of concern that can be affected by optical proximity. Optical radius is dependent upon actual exposure conditions, and typically is a value between about 0.8 µm and 1.3 µm. In one example, each x coordinate is moved, i.e., decreased or increased, by a distance of 1.0 µm from the original coordinate and each y coordinate is moved, i.e., decreased or increased, by a distance of 1.0 µm. In another example, each x coordinate is moved by a smaller distance from the original x coordinate, such as 0.5 µm, and each y coordinate is also moved by a distance of 0.5 µm. In yet another example, each x coordinate value is moved by a distance of 10 µm and each y coordinate value is moved by a distance of 10 µm.

Examples of the resulting modified coordinates are illustrated in block 150 of FIG. 1A. As illustrated therein, the smaller values of the original x coordinates of the vertices are decreased, the smaller values of the original y coordinates of the vertices are decreased, the larger values of the original x coordinates of the vertices are increased, and the larger values of the original y coordinates of the vertices are increased. Here, examples of the expanded x-y coordinate values obtained by this step are illustrated in block 150. The coordinates (99, 99), (99, 102), (102, 102), (102, 99) are expanded coordinates corresponding to the site #1 for a first feature of concern and expanded x-y coordinate values including the coordinates (138, 2445), correspond to a site #2 for a second feature of concern.

As further shown in FIG. 1A, in a further step 160, a set of rectangular bounding boxes is determined which enclose the expanded coordinates of the identified features of concern. The original and the expanded coordinates of the vertices encompassing the features of concern need only follow the contours of each feature of concern; they need not be rectangular in shape. This step performs an additional expansion (or contraction), if needed, to obtain x-y coordinates of rectangular boxes which encompass each feature of concern. An example of the results of performing this step is illustrated in block 170. As bounding boxes, the coordinates of each site need only identify one corner of the bounding box and the size of the bounding box in the x and y dimensions. In the example illustrated in block 170, the corner having the lowest x and y coordinate values of one bounding box is identified by coordinates (99, 99) and the size (5, 5) of that bounding box is determined for a first feature of concern. The same is done for a second feature of concern by identifying the lowest x and y coordinate values (137, 2444), and the size (5, 5) of a corresponding bounding box.

Figure 3A:
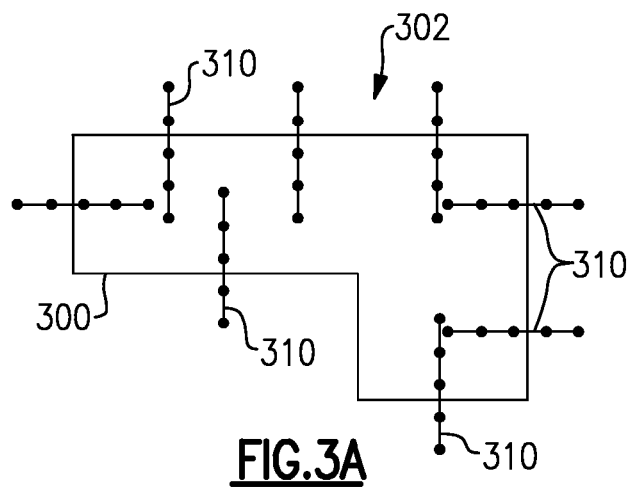
FIG. 3A is a diagram illustrating placement and data points of a set of cut lines utilized in connection with a shape when performing OPC verification in accordance with an embodiment of the invention.

Next, as illustrated in step 180, using the bounding box data obtained in blocks 160 and 170, a windowed subset of the original OPC corrected mask data is obtained for performing enhanced OPC verification as to a plurality of areas encompassing the identified features of concern. In one example, this step is performed by software manipulation of a copy of the OPC corrected mask data. The result of performing this step is to obtain a windowed data set 190. With the windowed data set, enhanced OPC verification can now be performed as described and illustrated below with respect to one or more examples illustrated in FIGS. 3A-3C.

Figure 2:
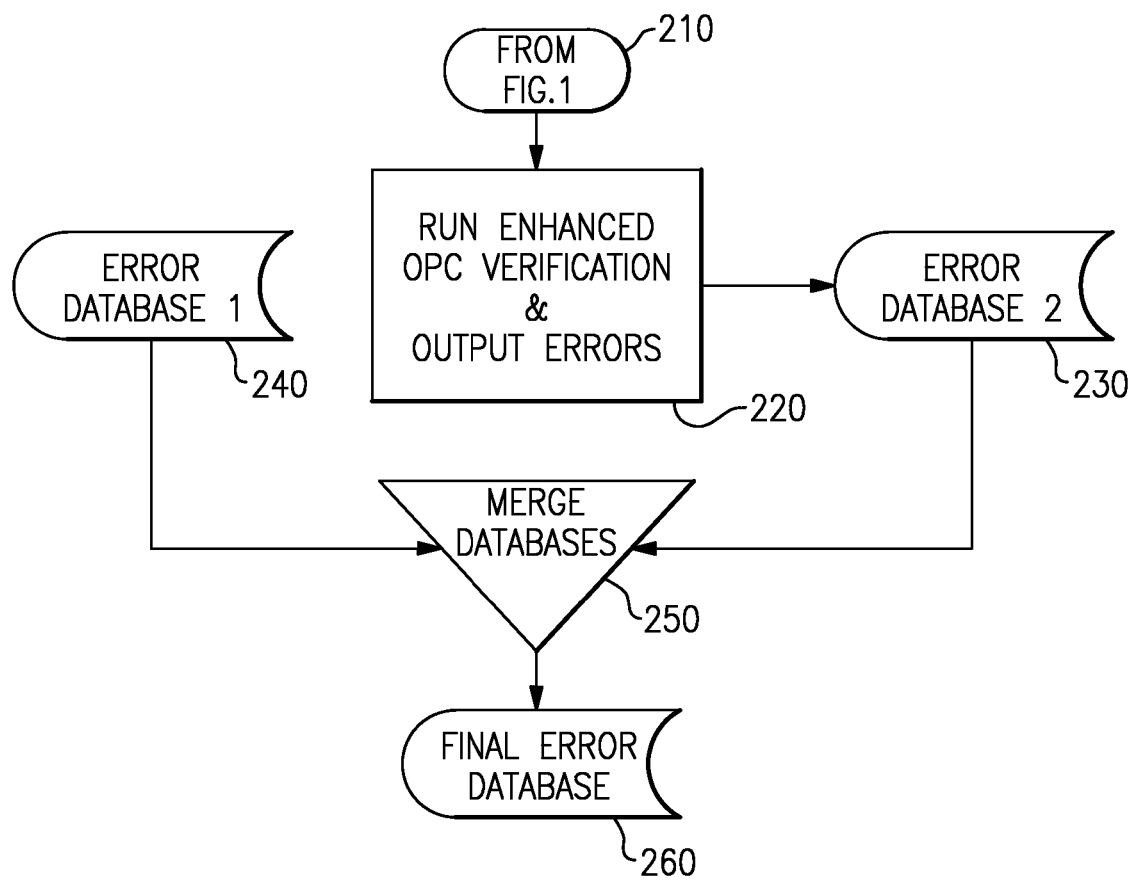
FIG. 2 is a flow chart illustrating a method of identifying errors when performing enhanced OPC verification in accordance with an embodiment of the invention.

FIG. 2 illustrates further stages in a method for identifying errors in an OPC corrected mask in accordance with an embodiment of the invention. As illustrated at block 210 of FIG. 2, a windowed data set (from step 190; FIG. 1A) of the original mask data is obtained and an enhanced OPC verification process is performed (block 220) as to that windowed data set. Coordinates of and parameters describing errors identified by the enhanced OPC verification process can then be stored in a second error database, for example, as illustrated at block 230. Data in an "error database 1" describing errors identified by the initial OPC verification process (block 240) and data in an "error database 2" (block 230) describing errors identified by the enhanced verification process can now be merged (block 250) to form a merged error database (block 260) containing error data obtained from both databases (blocks 230, 240).

Figure 3B:
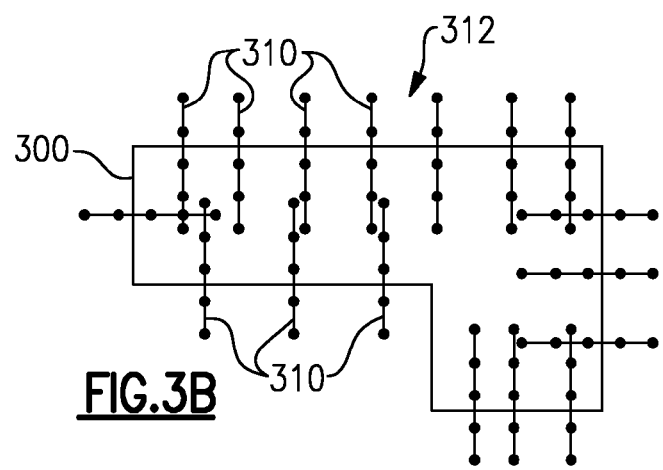
FIG. 3B is a diagram illustrating placement and data points of a set of cut lines utilized in connection with a shape when performing enhanced OPC verification in accordance with an embodiment of the invention.
Figure 3C:
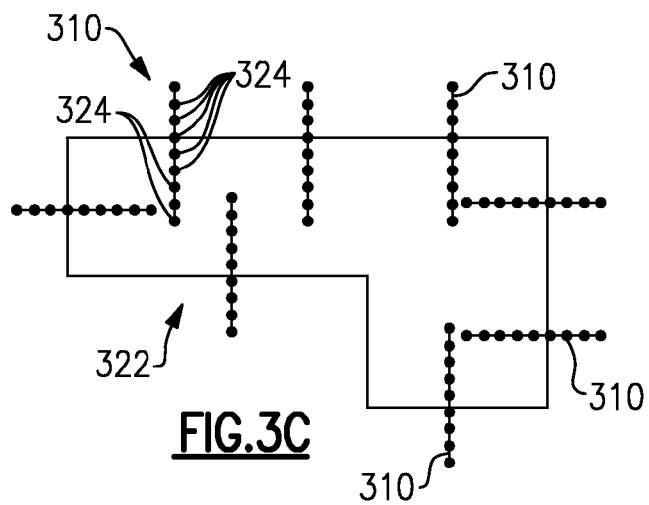
FIG. 3C is a diagram illustrating placement and data points of a set of cut lines utilized in connection with a shape when performing enhanced OPC verification in accordance with an embodiment of the invention.

The enhanced OPC verification process (step 220) can be performed by varying one or more of a variety of different variables than those which are varied when performing the initial OPC verification process (step 120; FIG. 1A). In one example, when the initial OPC verification process is performed using a first number of cut lines 310 (FIG. 3A) across each mask shape 300 (as depicted at 302), the enhanced OPC verification process can be performed using a greater number of cut lines 310 across each mask shape 300, as depicted at 312 (FIG. 3B). Alternatively, as shown in FIG. 3C, the enhanced OPC verification can be performed using the same number of cut lines 310 as in the initial OPC verification process (FIG. 3A), but in such way as to obtain a greater number of data points 324 per cut line 310, as in the case depicted at 322 (FIG. 3C). Moreover, these variations can be combined, such that a greater number of cut lines and greater number of data points per cut line are used.

In another example, the "style" in which cut lines are selected is varied. For example, cut lines can be selected such that all cut lines are perpendicular to the edges of OPC corrected mask shapes. In another alternative, cut lines are drawn which radiate out from corners of the mask shapes.

In another example, the enhanced OPC verification process can be based on a different type of data, such as based on the simulated results of features obtained by etching actual material layers of a substrate using a photoimageable layer patterned in accordance with the mask. Another way that the enhanced OPC verification process can be performed is by simulating the results of varying the focus, dose or both of an exposure to be obtained using the mask and then reviewing the results thereof. In this connection, verification can be performed using a series of models utilizing non-nominal data, i.e., data describing different marginal conditions relating to focus, dose, or both, and reviewing the results of exposure under each such condition.

In still another example, the enhanced OPC verification process can model the effects of misalignment between different mask levels. For example, the verification process can be performed for different degrees of misalignment between features of one mask level and those of another. For example, in this case, a via shape may be shifted by the amount of the designated alignment tolerance, and then a determination is made whether the mask shapes are still sufficiently aligned.

In yet another example, the effects of different variations in mask sizes can be tested. Still another way that the enhanced OPC verification process can be performed is to revise failure criteria, e.g., by tightening tolerances, and determining whether the tested shape meets the revised failure criteria when performing the OPC verification process.

Yet another example for performing enhanced OPC verification is to use a different simulation engine than the simulation engine used to perform the initial OPC verification process. For example, when grid-based simulation is used to perform the initial OPC verification, a fragmentation-based engine can be used to perform the enhanced OPC verification process. Specifically, the enhanced OPC verification process can utilize a process which is deemed to be more accurate, but typically slower to perform per unit area of the mask than the initially performed OPC verification process.

Other ways in which the enhanced OPC verification process can differ from the initially performed OPC verification process include various additional checks performed as to the quality of the simulated or real aerial image, photoresist image, additional checks concerning the degree of overlap between features of the same or different mask levels or a combination of such checks. Other checks which can be performed as part of the enhanced OPC verification include simulations of the expected performance to be achieved by the observed width of gate shapes of a mask. Stated another way, the degree to which the width of a gate conductor is controlled affects the performance of a transistor or critical circuit which includes the transistor.

FIGS. 4 through 7 illustrate an example in accordance with an embodiment of the invention of obtaining a windowed region on which an enhanced OPC verification process is to be performed. FIG. 4 illustrates shapes 410 of a photoresist model of an image to be obtained using a mask described by OPC corrected mask data. A feature of the image, identified as being a concern is indicated at 420. X and Y coordinate values are obtained which identify the feature's location in the image. In FIG. 5, modified coordinate values are obtained which define a bounding box 510. The bounding box defines area which completely encompasses some features 520 but only partially encompasses other features 530. Features 540 which lie completely outside of the bounding box are then discarded, leaving only the features 520 which are encompassed by the bounding box 510 and other features 530 which lie partially within the bounding box 510, as illustrated in FIG. 6. Then, as illustrated in FIG. 7, portions of the features which lie partially outside the bounding box are now discarded, leaving only the portions 550 of those features which lie within the bounding box 510 and the features 520 which lie entirely within the bounding box 510. The windowed area inside the bounding box 510 will then be processed using the enhanced OPC verification process.

Figure 8:
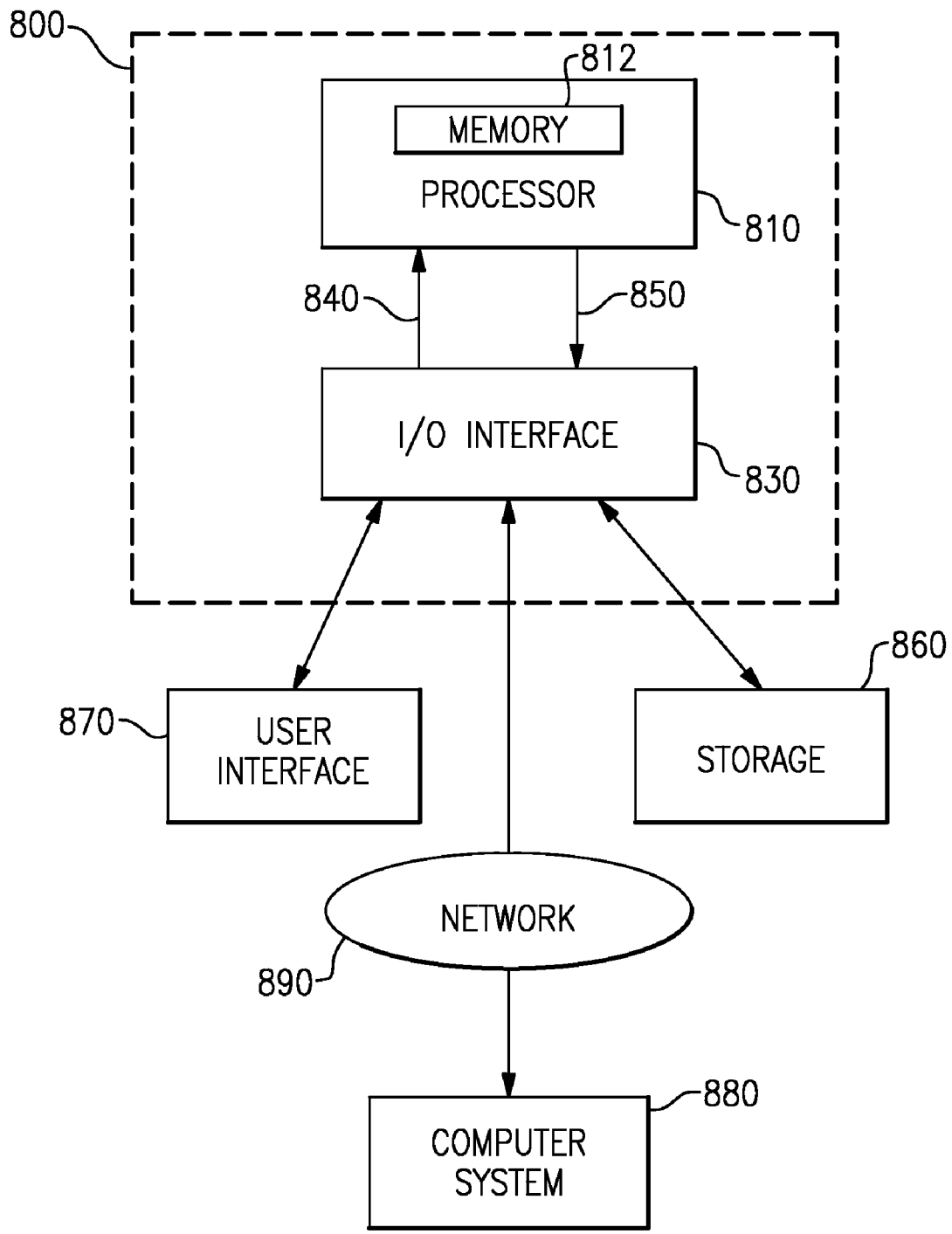
FIG. 8 is a block diagram illustrating an information processing system operable to perform an OPC verification process in accordance with an embodiment of the invention.

FIG. 8 illustrates an information processing system 800 in accordance with an embodiment of the invention. The information processing system includes a processor 810 provided with a memory 812. The processor 810 may be a single processor or may include a plurality of processors arranged to execute instructions of a program in a parallel or semi-parallel manner. An input output interface 830 including a network interface (hereinafter, collectively referenced as "I/O interface") is provided for inputting a program including instructions and data for performing a method, such as that described above with reference to FIGS. 1A and 2, to the CPU 810 and for outputting the results of executing a program. The I/O interface 830 preferably includes one or more types of interfaces to removable digital storage media such as a magnetic disk, magneto-optic disk, read/write disc, read only optical disc, digital tape, removable disk drive, removable solid state memory such as a portable memory card, among others. The I/O interface 830 includes a network interface such as a modem or network adapter card for permitting transfer of information to and from a network. The I/O interface 830 may also include a display or other user interface 870 for outputting information to a user, inputting information from the user or both. The user interface 870 may additionally include one or more other interface devices such as a keyboard, mouse, speaker, joystick, scanner, printer, etc. and the like. To the extent that any of the above described types of removable storage media are inserted or connected to the I/O interface, a program containing a set of instructions that is stored in such removable storage medium can be transferred as input 840 between the I/O interface 830 and the processor 810. In addition to the program, data, e.g., one or more of OPC mask data, aerial image data, circuit design data, other data, etc., to be operated upon by the instructions is also input to the processor 810 through the I/O interface 830, e.g. from storage 860 or from one or more computer systems 380, e.g., through a server computer 880 through a network 890. Once the program and the data set to be operated upon have been at least partially loaded into the processor 810, the processor then executes the set of instructions of the program relative to the data and provides output 850 to the I/O interface 830 connected thereto.

In one embodiment, a program containing information, e.g., instructions for performing a method according to an embodiment of the invention is stored on one or more removable storage media to be provided to the I/O interface 830 and loaded into the processor 810. Alternatively, the program containing the instructions is transferred from storage 860, a removable storage medium or a memory of one or more other computers, e.g., computer system 880 or other storage devices of a network to a modem, network adapter or other device of the I/O interface 830 and further transferred therefrom to the processor 810. After the processor 810 receives and loads at least a part of the program into memory, the program is then executed relative to the set of data input to the processor 810. In such way, OPC verification in accordance with one or more of the above-described methods can be performed in accordance with an embodiment of the invention.

While the invention has been described in accordance with certain preferred embodiments thereof, many modifications and enhancements can be made thereto without departing from the true scope and spirit of the invention, which is described in the claims appended below.

What is claimed is:

1. A method of performing optical proximity correction ("OPC") verification, comprising using one or more information processing systems to perform steps including:
    performing initial OPC verification at a first computational intensity to identify features of concern in at least one of optical proximity corrected data relating to shapes of the photomask, optical proximity corrected data relating to an aerial image to be obtained using the photomask, or optical proximity corrected data relating to a photoresist image to be obtained in a photoimageable layer using the photomask;
    identifying a plurality of areas of the at least one of the photomask, aerial image or photoresist image which incorporates the identified features of concern, the plurality of identified areas occupying substantially less area than a total area of the photomask which is occupied by features;
    performing enhanced OPC verification at a second computational intensity greater than the first computational intensity, the enhanced OPC verification being limited to the plurality of identified areas; and
    determining problems, if any, of the at least one of the photomask, aerial image or photoresist image based on the results of performing the enhanced OPC verification.

2. The OPC verification method as claimed in claim 1, wherein the step of performing initial OPC verification includes analyzing geometric characteristics of designed shapes to be obtained using the photomask.

3. The OPC verification method as claimed in claim 1, wherein the step of performing initial OPC verification includes analyzing geometric characteristics of OPC corrected mask data relating to the shapes of the photomask.

4. The OPC verification method as claimed in claim 1, wherein the step of performing initial OPC verification includes identifying first features of the photoresist image to be obtained which meet one or more criteria.

5. The OPC verification method as claimed in claim 1, wherein the step of performing initial OPC verification is performed relative to a first area of the photomask which incorporates the plurality of identified areas, the first area being larger than a second area obtained by a sum of the plurality of identified areas.

6. The OPC verification method as claimed in claim 1, wherein the plurality of identified areas include first portions of first features, the first features being other than the identified features of concern, and the step of identifying the plurality of areas includes drawing bounding boxes which incorporate the identified features of concern and the first portions of the first features, and excluding second portions of the first features which occur outside of the bounding boxes.

7. The OPC verification method as claimed in claim 1, wherein the enhanced OPC verification includes performing OPC verification while varying variables affecting a quality of the at least one of the photomask, the aerial image or the photoresist image by a greater amount than when performing the step of initial OPC verification.

8. The OPC verification method as claimed in claim 7, wherein the enhanced OPC verification includes performing OPC verification while varying a greater number of variables which affect a quality of the at least one of the photomask, the aerial image or the photoresist image than a number of variables varied when performing the step of initial OPC verification.

9. The OPC verification method as claimed in claim 1, wherein the enhanced OPC verification includes performing OPC verification while varying a greater number of variables which affect a quality of the at least one of the photomask, the aerial image or the photoresist image than a number of variables varied when performing the step of initial OPC verification.

10. The OPC verification method as claimed in claim 1, wherein the step of performing initial OPC verification is performed with respect to the shapes of a photomask using a first number of cut lines cutting across each shape and the step of performing enhanced OPC verification is performed using a second number of cut lines cutting across each shape, the second number being greater than the first number.

11. The OPC verification method as claimed in claim 1, wherein the step of performing initial OPC verification is performed with respect to the shapes of a photomask using a first number of cut lines cutting across each shape and a second number of data points per cut line and the step of performing enhanced OPC verification is performed using the first number of cut lines cutting across each shape and a third number of data points per cut line, the third number being greater than the second number.

12. An information processing system comprising at least one processor and a set of instructions executable by the at least one processor to perform an optical proximity correction ("OPC") verification method, the method comprising:
    performing initial OPC verification at a first computational intensity to identify features of concern in at least one of optical proximity corrected data relating to shapes of the photomask, optical proximity corrected data relating to an aerial image to be obtained using the photomask, or optical proximity corrected data relating to a photoresist image to be obtained in a photoimageable layer using the photomask;
    identifying a plurality of areas of the at least one of the photomask, aerial image or photoresist image which incorporates the identified features of concern, the plurality of identified areas occupying substantially less area than a total area of the photomask which is occupied by features;

performing enhanced OPC verification at a second computational intensity greater than the first computational intensity, the enhanced OPC verification being limited to the plurality of identified areas; and determining problems, if any, of the at least one of the photomask, aerial image or photoresist image based on the results of performing the enhanced OPC verification.

13. The information processing system as claimed in claim 12, wherein the step of performing initial OPC verification includes analyzing geometric characteristics of designed shapes to be obtained using the photomask.

14. The information processing system as claimed in claim 12, wherein the step of performing initial OPC verification is performed relative to a first area of the at least one of the photomask, the aerial image or the photoresist image which incorporates the plurality of identified areas, the first area being larger than a second area obtained by a sum of the plurality of identified areas.

15. The information processing system as claimed in claim 12, wherein the plurality of identified areas include first portions of first features, the first features being other than the identified features of concern, and the step of identifying the plurality of areas includes drawing bounding boxes which incorporate the identified features of concern and the first portions of the first features, and excluding second portions of the first features which occur outside of the bounding boxes.

16. The information processing system as claimed in claim 12, wherein the enhanced OPC verification includes performing OPC verification while varying variables affecting a quality of the at least one of the photomask, the aerial image or the photoresist image by a greater amount than when performing the step of initial OPC verification.

17. The information processing system as claimed in claim 12, wherein the enhanced OPC verification includes performing OPC verification while varying a greater number of variables which affect a quality of the at least one of the photomask, the aerial image or the photoresist image than a number of variables varied when performing the step of initial OPC verification.

18. A computer-readable recording medium having a set of instructions recorded thereon, the instructions being executable by at least one processor to perform an optical proximity correction ("OPC") verification method, the method comprising:

performing initial OPC verification at a first computational intensity to identify features of concern in at least one of optical proximity corrected data relating to shapes of the photomask, optical proximity corrected data relating to an aerial image to be obtained using the photomask, or optical proximity corrected data relating to a photoresist image to be obtained in a photoimageable layer using the photomask;

identifying a plurality of areas of the at least one of the photomask, aerial image or photoresist image which incorporates the identified features of concern, the plurality of identified areas occupying substantially less area than a total area of the photomask which is occupied by features;

performing enhanced OPC verification at a second computational intensity greater than the first computational intensity, the enhanced OPC verification being limited to the plurality of identified areas; and determining problems, if any, of the at least one of the photomask, aerial image or photoresist image based on the results of performing the enhanced OPC verification.

19. The computer-readable recording medium as claimed in claim 18, wherein the step of performing initial OPC verification is performed relative to a first area of the at least one of the photomask, the aerial image or the photoresist image which incorporates the plurality of identified areas, the first area being larger than a second area obtained by a sum of the plurality of identified areas.

* * * * *